United States Patent [19]

Byrnes et al.

[11] Patent Number: 5,207,585
[45] Date of Patent: May 4, 1993

[54] THIN INTERFACE PELLICLE FOR DENSE ARRAYS OF ELECTRICAL INTERCONNECTS

[75] Inventors: Herbert P. Byrnes, Poughkeepsie; Jean-Marc Halbout, Larchmont; Michael R. Scheuermann, Katonah, all of N.Y.; Eugene Shapiro, Stamford, Conn.

[73] Assignee: International Business Machines Corporation, Armonk, N.Y.

[21] Appl. No.: 606,413

[22] Filed: Oct. 31, 1990

[51] Int. Cl.$^5$ .............................................. H01R 9/09
[52] U.S. Cl. ....................................... 439/66; 439/67; 439/77; 439/591
[58] Field of Search ....................... 439/66, 67, 77, 91, 439/591, 908

[56] References Cited

U.S. PATENT DOCUMENTS

| | | |
|---|---|---|
| 3,401,126 | 9/1968 | Miller et al. . |
| 3,429,040 | 2/1969 | Miller . |
| 3,541,222 | 11/1970 | Parks et al. . |
| 3,634,807 | 1/1972 | Grobe et al. ......................... 439/66 |
| 3,654,585 | 4/1972 | Wickersham . |
| 3,680,037 | 7/1972 | Nellis et al. . |
| 3,806,801 | 4/1974 | Bove . |
| 3,862,790 | 1/1975 | Davies et al. . |
| 3,971,610 | 7/1976 | Buchoff et al. . |
| 4,027,935 | 6/1977 | Byrnes et al. . |
| 4,038,599 | 7/1977 | Bove et al. . |
| 4,184,729 | 1/1980 | Parks et al. . |
| 4,581,679 | 4/1986 | Smolley . |
| 4,707,657 | 11/1987 | Boegh-Petersen . |
| 4,793,814 | 12/1988 | Zifcak . |
| 4,837,507 | 6/1989 | Hechtman . |
| 4,991,290 | 2/1991 | MacKay . |
| 5,020,219 | 6/1991 | Leedy . |
| 5,061,192 | 10/1991 | Chapin et al. ......................... 439/591 |
| 5,069,628 | 12/1991 | Crumly ................................ 439/77 |
| 5,133,119 | 7/1992 | Afshari et al. ......................... 439/66 |

OTHER PUBLICATIONS

Test Probes Short Form Catalog, Ostby-Barton Test Probes, 1988 Catalog.
ISOCON/TM Interconnections, Printed by Rogers Corporation, 1989.

Primary Examiner—Paula A. Bradley
Attorney, Agent, or Firm—Robert M. Trepp

[57] ABSTRACT

A thin interface pellicle probe for making temporary or permanent interconnections to pads or bumps on a semiconductor device wherein the pads or bumps may be arranged in high density patterns is described incorporating an electrode for each pad or bump wherein the electrode has a raised portion thereon for penetrating the surface of the pad or bump to create sidewalls to provide a clean contact surface and the electrode has a recessed surface to limit the penetration of the raised portion. The electrodes may be affixed to a thin flexible membrane to permit each contact to have independent movement over a limited distance and of a limited rotation. The invention overcomes the problem of making easily breakable electrical interconnections to high density arrays of pads or bumps on integrated circuit structures for testing, burn-in or package interconnect and testing applications.

12 Claims, 16 Drawing Sheets

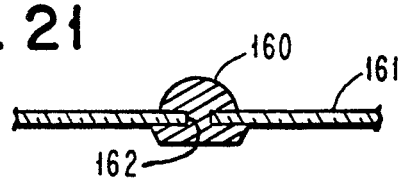
FIG. 21
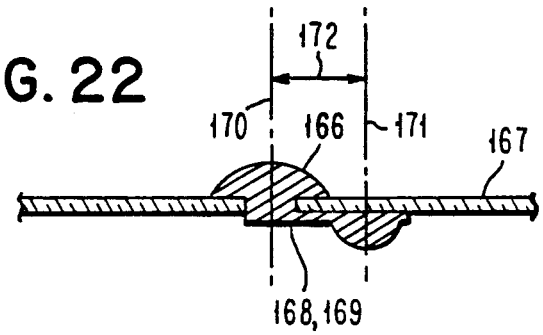
FIG. 22
FIG. 23
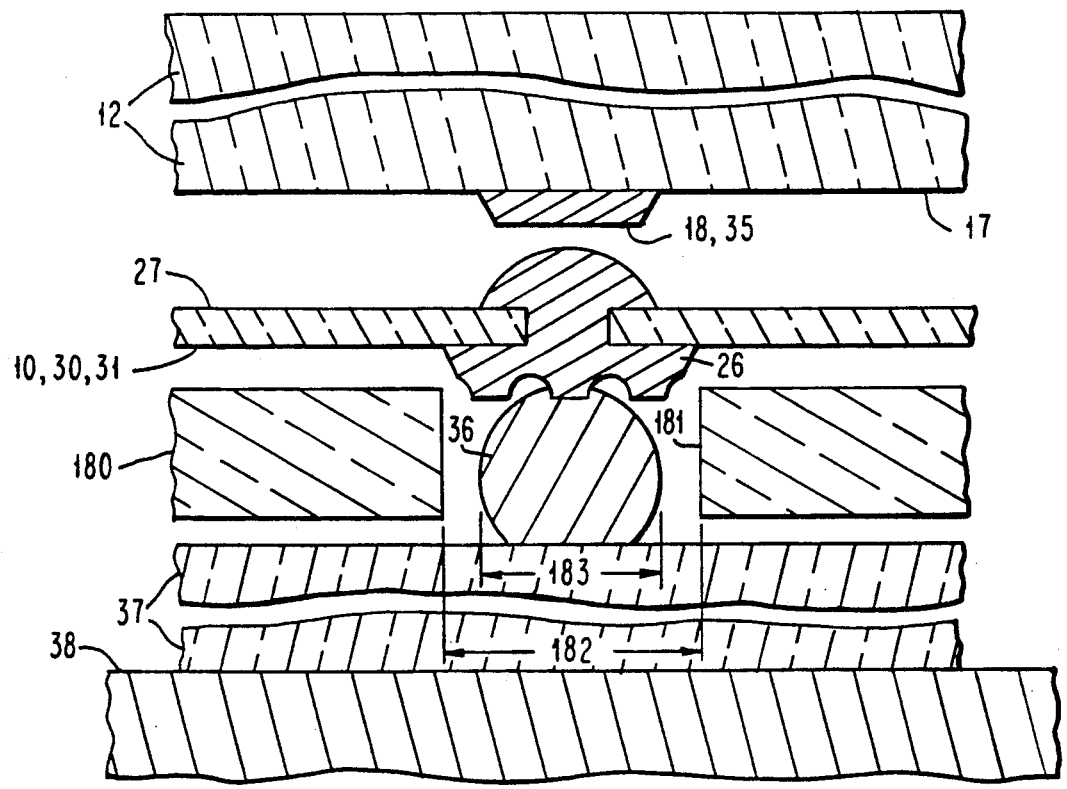

THIN INTERFACE PELLICLE FOR DENSE ARRAYS OF ELECTRICAL INTERCONNECTS

FIELD OF THE INVENTION

This invention relates to semiconductor and package testing as well as electrical interconnections and in particular, to a thin interface pellicle, film or membrane which contains contacts and vias on both sides for interconnecting a semiconductor chip or wafer to a space transformer for electrical testing or to a package structure for utilization.

BACKGROUND OF THE INVENTION

Semiconductor devices or chips and other electrical devices normally are electrically interconnected for testing, burn-in and utilization. Interconnection methods have included rigid probes and contacts, flexible probes and contacts, wire bonding, soldering and welding. The topology of the interconnections on a chip has varied from a line or linear array of peripherally spaced pads, bumps or contacts to an area array of two dimensionally spaced pads or bumps. The pads or bumps in either a linear or area array normally have a uniform width and center to center spacing in the array. The array of contacts in an area array are usually arranged in a pattern such as rows and columns orthogonal to one another. The trend in integrated circuit chips or dies is for denser arrays of contacts and for more contacts per chip. One manufacturer, International Business Machines Corporation, Armonk, N.Y., uses a contact called a C4 bump which extends above the integrated circuit by about 0.125 millimeters and which is composed mostly of lead and tin (Pb-Sn) and is round or circular in cross-section parallel to the plane of the array and is curved from its sides to the top surface of the bump where the interconnection is made to another electrode. In U.S. Pat. No. 3,401,126 granted September, 1986 to L. F. Miller, a highly conductive electrode which is substantially not wetted by solder is described. In U.S. Pat. No. 3,429,040 granted February, 1969 to L. F. Miller, ductile contacts of a microminiature element which may be joined to connecting areas at the surface of an insulating substrate is described. Both of the above patents are assigned to the assignee herein.

In order to test high density two-dimensional arrays of contacts at high speeds, the current probing apparatus has been modified to be correspondingly more dense. One type or category of probe is known as a "Cobra Probe" which is described in U.S. Pat. No. 4,038,599 granted Jul. 26, 1977 to Bove et al. The Cobra Probe has a plurality of wires mounted in parallel with their ends ending in a plane transverse to the axis of the wires. The wire ends are also shaped to facilitate probing. Each wire is also rigid enough to apply pressure to the corresponding contact when mechanically moved against the contact yet flexible or springy enough to prevent excessive pressure on or deformation of the contact. While each wire is aligned correctly its ends are floating and the cumulative pressure exerted by the wires is large with respect to the area of the contacts. The wires sometimes short out to adjacent wires or carry dirt and fragments which are dropped on the array. Further an array of Cobra Probes is limited by its mechanical assembly, electrical bandwidth due to capacitance and inductance, and center-to-center spacing of probes or array density. The Cobra Probe may have probe wires 5.08 mm (0.20 in.) long, a diameter of 0.102 mm (0.004 in.), a center-to-center spacing of 0.203 mm (0.008 in.), a self-inductance of 2.5 nH and a bulk resistance of 180 millohms.

Presently interconnections during burn-in of semiconductor devices must withstand extreme temperature changes as well as long times at extreme temperatures. Chip signal terminals and power terminals are sometimes soldered for this purpose and then resoldered for utilization. Faulty interconnections during burn-in or testing can be attributed to a failure of the chip. The chips which are tested faulty are sometimes discarded with out further testing.

In U.S. Pat. No. 3,541,222 which issued on Nov. 17, 1970 to H. L. Parks et al., a connector screen is described for interconnecting adjacent surfaces of laminar circuits. A sheet of insulating material is provided containing a matrix of spaced apart conductive connector elements embedded in the sheet and protruding from both sides.

In U.S. Pat. No. 3,654,585 which issued on Apr. 4, 1972 to P. D. Wickersham, a transition plate is described which comprises a thin baseplate of insulating material, such as a thin fiberglass sheet with a layer of copper on each side being etched to leave only the contact pads on the bottom side of the baseplate and the contact pads on the top side of the baseplate electrically interconnected through the baseplate to provide a coordinate conversion interface between an array of spring pins connected to a tester and a printed circuit board to be tested.

In U.S. Pat. No. 4,581,679 which issued on Apr. 8, 1986 to R. Smolley, an interconnection medium is described that includes an insulated board with openings through it, and a number of connector elements in the form of compressible wads of conductive wire inserted therein. The connector elements inserted in selected openings in the insulated board are compressed into contact with contact areas formed on the circuit package elements.

In U.S. Pat. No. 4,707,657 which issued on Nov. 17, 1987 to A. Boegh-Petersen, a connector assembly is described comprising a printed circuit board having pads arranged on both surfaces with interconnections therethrough for connecting a printed circuit board tester to a printed circuit board to be tested. Spherical, cylindrical, cubic or wire mesh bodies may be placed above the pads to provide a contact interface to the connector interface. Also a sheet made of electrically insulating material with through-going electrically conductive paths embedded therein may be placed over the pads. Coil springs in recessed holes over pads may position metal contacts above the springs against an adjacent surface or test pad.

In U.S. Pat. No. 4,837,507 which issued on Jun. 6, 1989 to C. D. Hechtman, a high frequency test fixture is described incorporating a support body including an electrically conducting compliant medium having parallel major surfaces and a first and second array of bendable Euler column probes held by the support body and extending between the major surfaces of the support body. Each probe of the first array of probes may be electrically insulated from the compliant medium. The second array of probes being positioned between two adjacent probes of the first array and may be in electrical contact with the compliant medium.

A connector manufactured by Rogers Corporation, One Technology Drive, Rogers, Conn. has a pressuremated connection for arrays of contact pads which includes flat S-shaped, beryllium copper conductors suspended in a high stress retention cellular elastomer. In using the connector, a downward force is applied to the connector, the S-shaped conductors rotate, providing wiping action at each interface. The cellular elastomer maintains the contact force of the S-shaped conductor providing a gas-tight seal. The connector has been described in a sales brochure entitled "ISO-CON/TM INTERCONNECTIONS", pages 1-5, printed by Rogers Corporation.

In U.S. Pat. No. 4,793,814 which issued on Dec. 27, 1988 to M. S. Zifeak et al. and assigned to Rogers Corporation, an area connector for providing electrical interconnection between contact pads on first and second printed circuit boards is described comprising a bodily-rotatable, electrical conductive interconnect element extending through the thickness of the support member i.e. a flat S-shaped conductor in a cellular elastomer.

Further, various test probes have been manufactured and used for testing printed circuit boards. A 1988 catalog entitled "Test Probes Short Form Catalog" by Ostby-Barton Test Probes, Warick, R.I., shows a number of test probe tips that may be used for testing lands, pads, leads, holes etc. on a printed circuit board. Various probe tips are shown including shapes described as concave, spear, flat, spherical radius, convex, serrated, flexi-needle, crown, kaleidoscope, star, chisel, and tulip.

SUMMARY OF THE INVENTION

An apparatus is described for providing electrical contact between an array of first contacts on a first rigid probe adapted to transfer force and a corresponding array of second contacts on an electrical device supported to withstand the force comprising a flexible membrane having an upper surface and a lower surface, an array of electrodes formed in the flexible membrane and extending above the upper surface and below the lower surface along respective longitudinal axes of the electrodes, each electrode having a first predetermined length along the respective longitudinal axis, the flexible membrane having a thickness to form at times a curved upper and lower surface having a minimum radius in localized regions and an elasticity to provide for a predetermined elastic deformation of the flexible membrane in localized regions to permit the electrodes to move independently of each other whereby each electrode of the array of electrodes corresponds in position to a respective contact of the array of first contacts above and to a respective contact of the array of second contacts below so that the array of first contacts is electrically coupled to the array of second contacts by way of the array of electrodes on the flexible membrane there between.

Further, an apparatus is described for providing mechanical and electrical contact to a raised conductive bump on an electrical device comprising a body having a first raised portion thereon for penetrating the surface of the conductive bump to create sidewalls having a predetermined depth in the conductive bump, the body having a second recessed portion positioned adjacent the first raised portion to limit the penetration of the first raised portion into the surface of the conductive bump.

Further, a method is described for testing an electrical device comprising the steps of positioning a pellicle adjacent a space transformer, positioning the electrical device below the pellicle, supporting the electrical device to withstand a predetermined force, and moving the electrical device towards the space transformer, with the predetermined force finally applied, whereby electrical contact is made between pads on the space transformer with corresponding electrodes on the pellicle with corresponding contacts on the electrical device.

Further, an apparatus is described for interconnecting an electrical device comprising an array of first contacts positioned in a two-dimensional array, a body, substrate, connector or housing for supporting said array of first contacts to withstand a predetermined force, a flexible membrane having an upper surface and a lower surface, an array of electrodes formed in the flexible membrane and extending above the upper surface and below the lower surface along respective longitudinal axes of the electrodes, each said electrode having a first predetermined length along said respective longitudinal axis, and the flexible membrane having a thickness to form at times a curved upper and lower surface having a minimum radius of curvature in localized regions and an elasticity to provide for a predetermined elastic deformation of the flexible membrane in localized regions to permit the electrodes to move independently, the lower surface of the array of electrodes positioned in electrical contact with the array of first contacts, the electrical device having an array of second contacts positioned in a two-dimensional array and supported by the electrical device to withstand the predetermined force, and second means for supporting the electrical device to withstand the predetermined force in fixed relationship with the array of first contacts, the upper surface of the array of electrodes in electrical contact with the array of second contacts.

BRIEF DESCRIPTION OF THE DRAWING

FIG. 21 is a ninth embodiment of the invention showing a current sensitive element.

FIG. 22 is a tenth embodiment of the invention showing a current sensitive element.

FIG. 23 is an eleventh embodiment of the invention showing an alignment and spacer sheet.

DESCRIPTION OF THE PREFERRED EMBODIMENTS

Figure 1A:
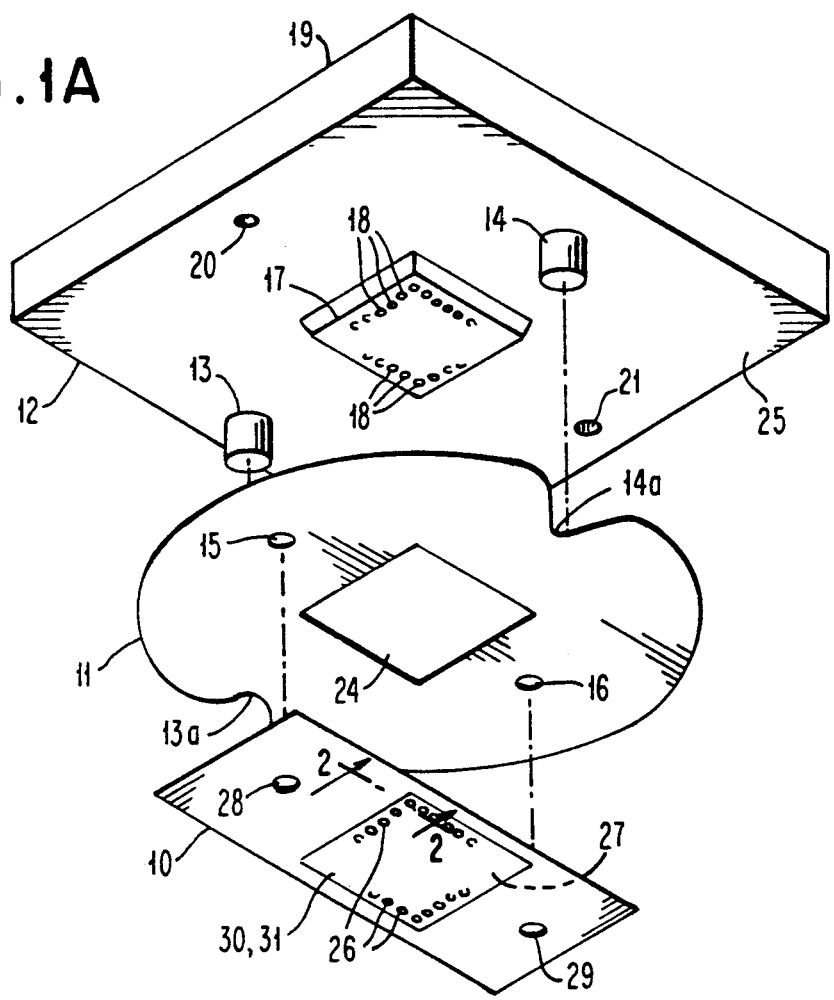
FIG. 1A is an exploded view of a first embodiment of the invention showing an interface pellicle probe, probe carrier and space transformer.
Figure 1B:
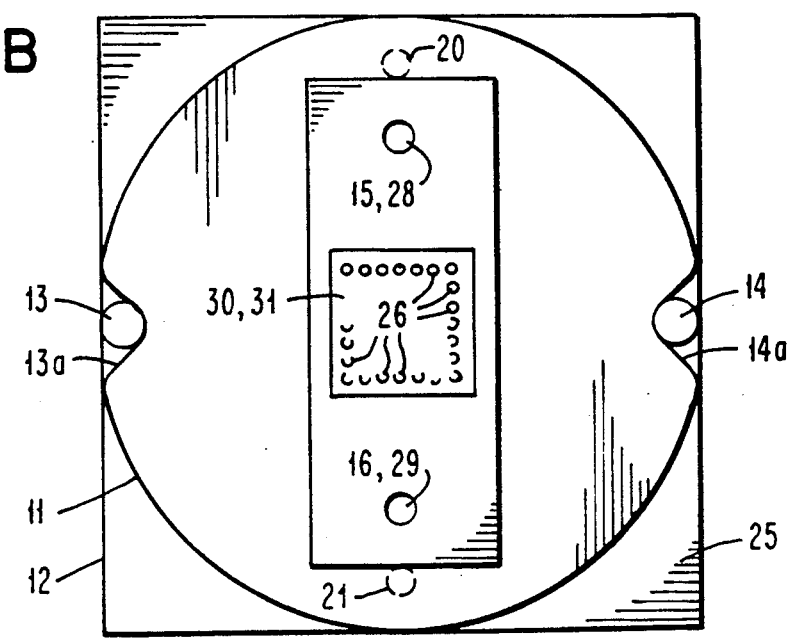
FIG. 1B is a bottom view of the first embodiment of the invention.

Referring to the drawing and more particularly to FIGS. 1A and 1B, an interface pellicle 10 is shown along with probe carrier 11 and space transformer 12. Interface pellical 10 may be a membrane, film or sheet of material to hold membrane 31 and electrode 26. Interface pellical 10 may be the same material as membrane 31. Alignment pins 13 and 14 on space transformer 12 function to align probe carrier 11 by way of alignment notches 13a and 14a and to align interface pellicle 10. Space transformer 12 is mechanically rigid to transfer force to the electrodes 26 in interface pellicle 10 without substantial deformation of space transformer 12.

Space transformer 12 has a raised portion or plateau 17 having electrical contacts 18 thereon at a high density to match on a one to one basis corresponding contacts on a package, chip, or wafer. Electrical contacts 18 may be connected to the upper surface 19 of space transformer 12 and spaced apart for electrical hookup to test equipment by way of conductive metalization from electrical contacts 18 through space transformer 12.

Space transformer 12 also has vacuum feed throughs 20 and 21 which function to hold probe carrier 11 in place. Probe carrier 11 has an opening 24 to allow probe carrier 11 to seat against lower surface 25 of space transformer 12 while permitting plateau 17 to pass through opening 24. Probe carrier 11 functions as a mounting and handling fixture for interface pellicle 10.

Interface pellicle 10 may be preassembled to probe carrier 11 with holes 28 and 29 aligned with holes 15 and 16 respectively on probe carrier 11. After alignment, interface pellicle 10 and probe carrier 11 may be joined together by a thin film 22 of adhesive material or by fusing them together. Interface pellicle 10 is position over plateau 17 with electrodes 26 on upper surface 27 aligned with the array of electrical contacts 18 by way of alignment notches 13a and 14a in probe carrier 11 and alignment pins 13 and 14. Lower surface 30 of pellicle 10 has the lower end of electrodes 26 extending therethrough and shaped for electrical contact to, for example, C4 bumps. C4 bumps are manufactured on semiconductor wafers by IBM Corporation and are well known in the art. Interface pellicle 10 includes a membrane 31 at least in the area of electrodes 26 and has openings therein with or without vias to permit fabrication of electrodes 26.

Membrane 31 is flexible to permit electrodes 26 to individually move, rock or rotate independent of the movement of adjacent electrodes 26. Flexibility of membrane 31 is provided by selecting a membrane thickness to form at times a curved upper and corresponding lower surface having a minimum radius of curvature in localized regions near respective electrodes 26. Further, membrane 31 may have a selected elasticity to provide for a predetermined elastic deformation in localized regions near respective electrodes 26 at times electrodes 26 may rotate and move with limited lateral displacement.

Figure 2:
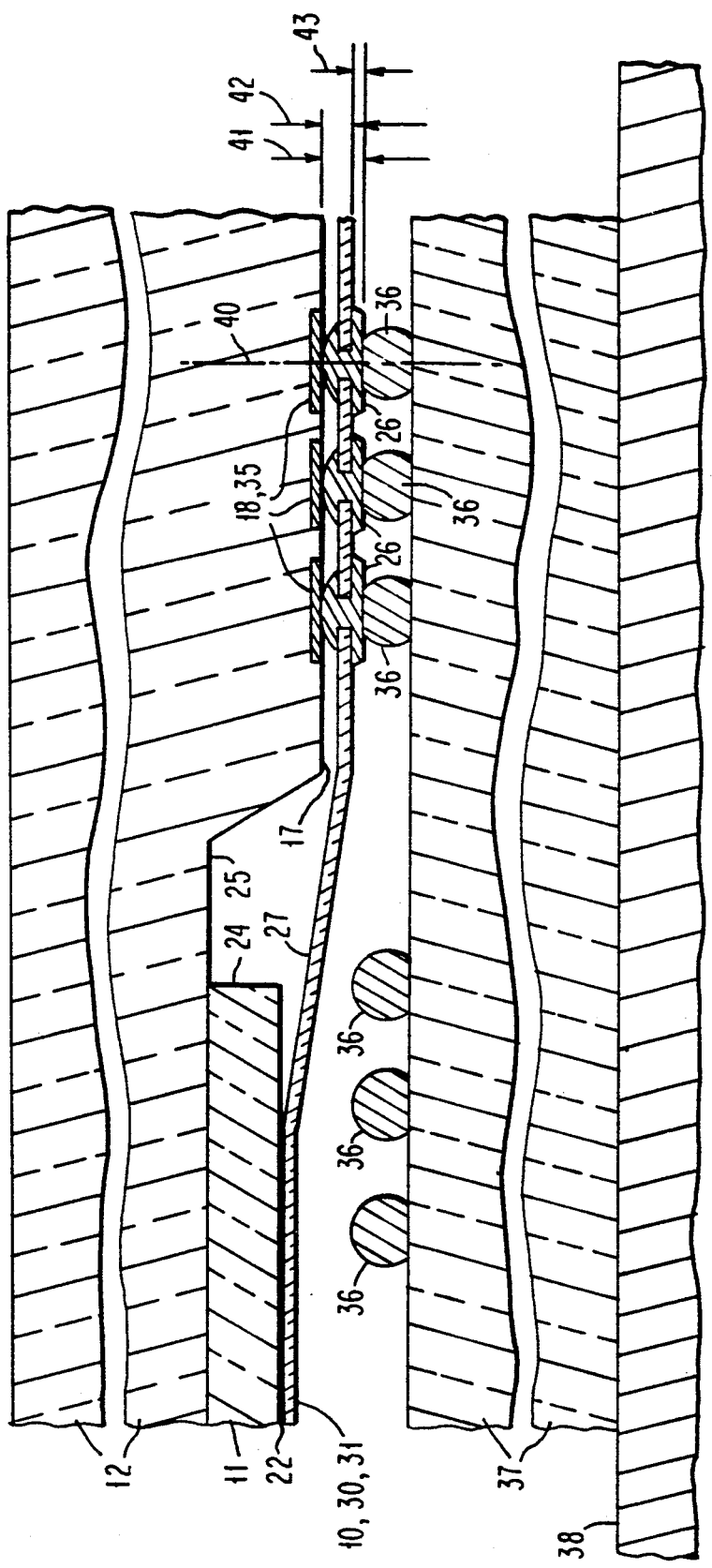
FIG. 2 is a cross-section view along the lines 2—2 of FIG. 1A showing an interface pellicle in contact between pads on a space transformer and C4 bumps on a wafer.

Referring to FIG. 2, an interface pellicle 10 and its array of electrodes 26 is shown in contact between pads 35 of electrodes 18 of space transformer 12 and C4 bumps 36 on semiconductor wafer 37. Wafer 37 is supported by platform 38 which may have the capability of moving in the x and y direction prior to electrical contact for indexing the position of the wafer and the circuit to be tested on the wafer. Wafer 37 may be moved in the z direction for making and breaking electrical contact.

Electrodes 26 have a longitudinal axis 40 which pass through the center of the electrode where it passes through membrane 31. The length of electrodes 26 may be substantially the same as each other and may be measured in the direction along longitudinal axis 40 as shown by arrow 41 in FIG. 2.

Figure 3A:
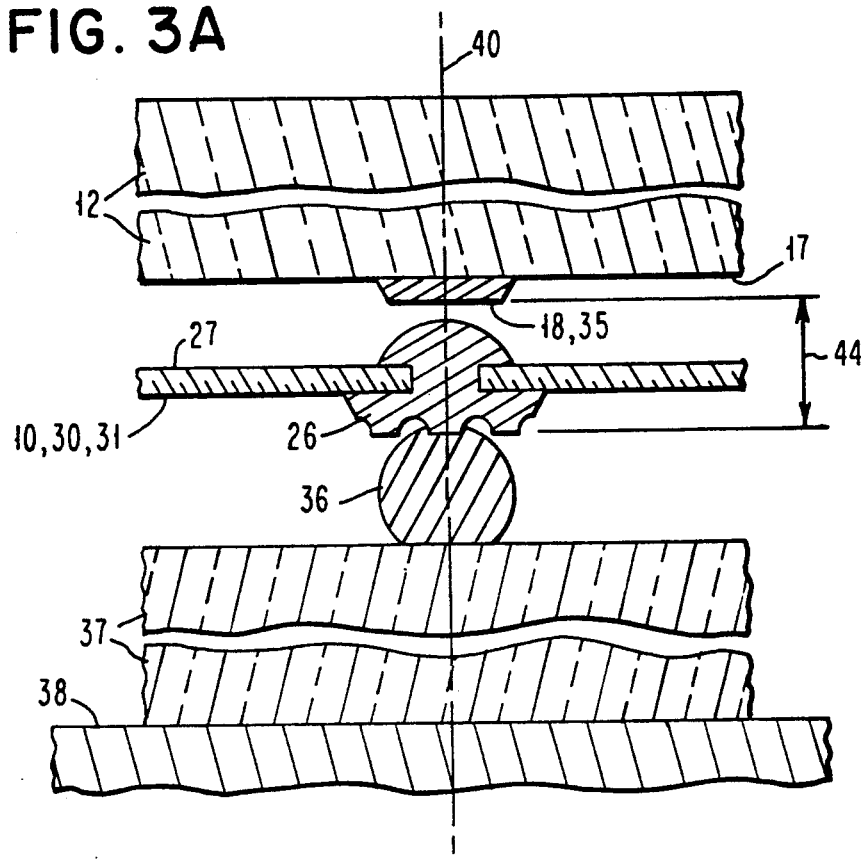
FIG. 3A is an enlarged view of FIG. 2, showing an interface pellicle positioned between a pad on a space transformer and a C4 bump on a wafer.

Arrow 42 in FIG. 2 shows that the distance between contacts 18 or pads 35 and C4 bumps 36 is less than the length of electrodes 26 shown by arrow 41 at the time of electrical testing or utilization to assure pressure or force is applied at the ends of electrodes 26. The pressure or force provides penetration of the C4 bumps 36 by a distance shown by arrow 43 resulting in piercing and forming a new clean surface free of oxide below the former C4 bump surface. The length of electrodes 26 is equal to the sum of the distances shown by arrows 42 and 43. Electrodes 26 on interface pellicle 10 may have a length of 0.0635 mm (0.0025 in.), a diameter of 0.051 mm (0.002 in.), a center-to-center spacing of 0.102 mm (0.004 in.), a self-inductance of less than 40 pH and a bulk resistance of less than 1 milliohm. FIG. 3A is an enlarged view of interface pellicle 10 and electrode 26 positioned between pad 18 on space transformer 12 and C4 bump 36 on wafer 37 prior to applying force to each electrode 26 by reducing the spacing or distance shown by arrow 44 between pad 18 and C4 bump 36 to a distance shown by arrow 42 in FIG. 2. In FIG. 3A, membrane 31 is substantially flat on its upper surface 27 and its lower surface 30 prior to pressure or force being applied to electrode 26 by space transformer 10. Membrane 31 is shown in FIG. 3A supporting electrode 26 with its axis 40 transverse and substantially orthogonal to upper surface 27 and lower surface 30.

Figure 3B:
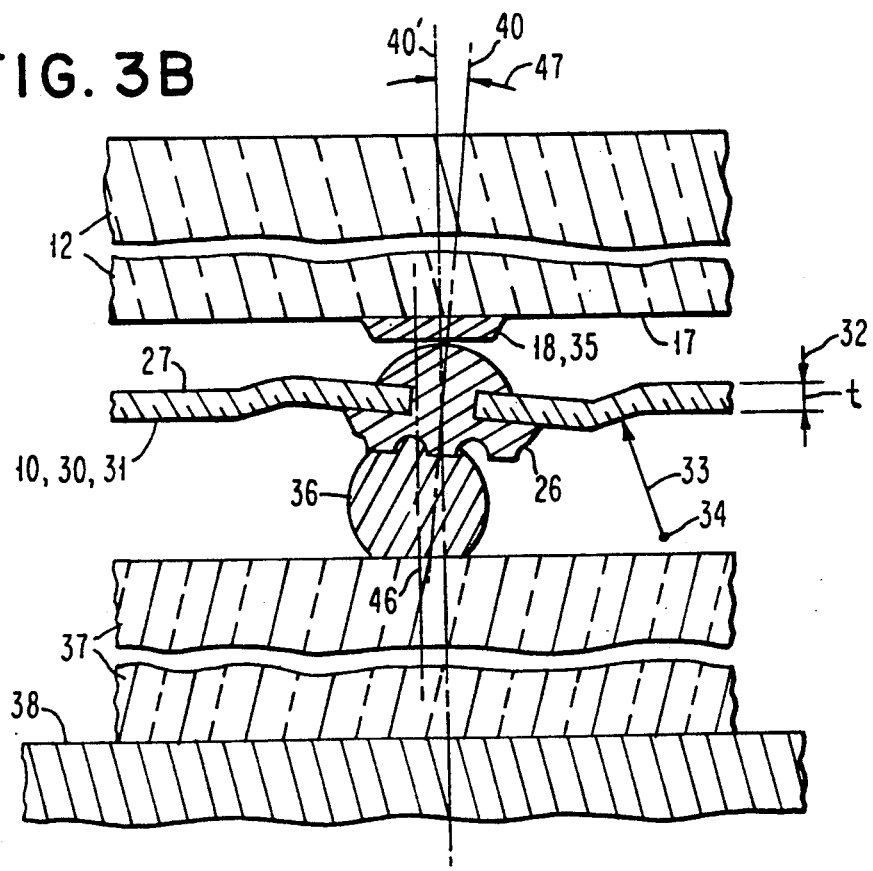
FIG. 3B is an enlarged view showing an electrode in electrical contact positioned between a pad on a space transformer and a C4 bump on a wafer.

FIG. 3B is an enlarged view of electrode 26 in electrical contact between pad 18 on space transformer 12 and C4 bump 36 on wafer 37 with force applied to cause electrode 26 to penetrate bump 36. As shown in FIG. 3B axis 40' does not align up with axis 46 of bump 36 causing a slight rotation of electrode 26 shown by axis 40. Axis 40' is the axis position of axis 40 prior to contact with bump 36. The amount of rotation of electrode 26, axis 40' with respect to axis 40, is shown by arrow 47 and may be 5 degrees and as much as 15 degrees or less. The misalignment may be deliberate or inadvertent depending on the design layout and tolerances. The distance between axis 40' and axis 46 provides the torque upon contact to rotate electrode 26. The amount of torque is dependent on the point or points of contact between electrode 26 and bump 36 and the force applied. Electrode 26 is presumed in FIG. 3B to rotate about the center of electrode 26 midway through membrane 31. Electrode 26 is allowed to rotate because membrane 31 is flexible having a thickness t shown by arrow 32. Upon rotation of electrode 26, membrane 31 has a curved upper and lower surface having a minimum radius r of curvature in localized regions shown by arrow 33 about point 34 in FIG. 3B. Membrane 31 has an elasticity to provide for the curved surface, a predetermined elastic deformation of membrane 31 in localized regions to permit electrode 26 to move or rotate independently.

Figure 4:
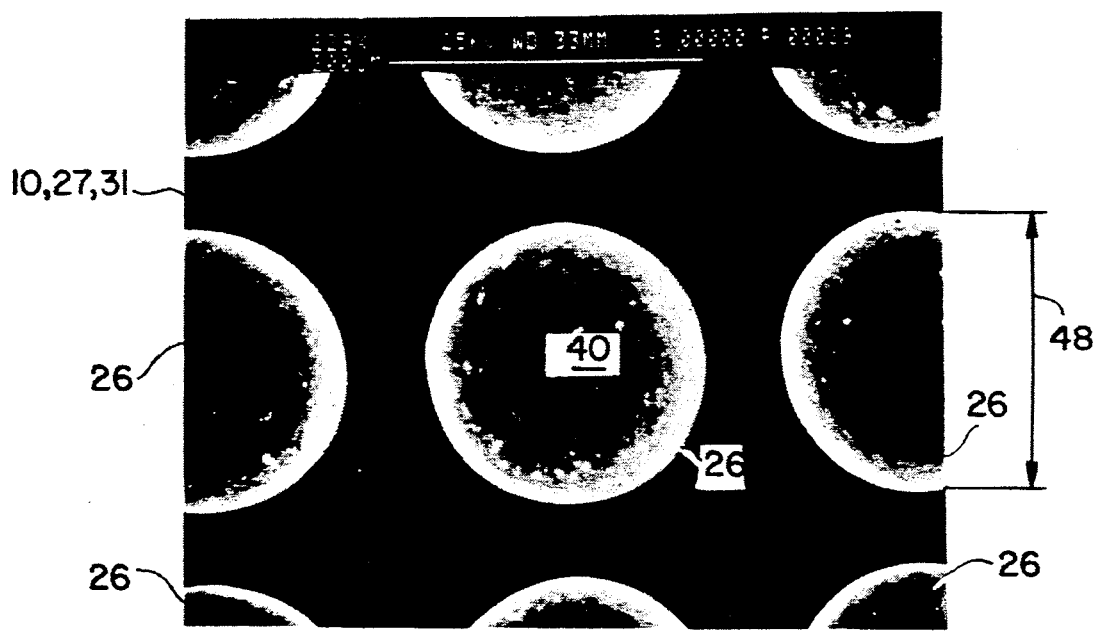
FIG. 4 is a view of an array of electrodes on the upper surface of a pellicle shown in FIG. 3A.

FIG. 4 is a view of electrodes 26 taken above upper surface 27 of interface pellicle 10. In FIG. 4 electrodes 26 are round or circular in cross-section and symetric about axis 40 and have a diameter shown by arrow 48. The height of electrode 26 above upper surface 27 may be in the range from about 0.025 to 0.075 millimeters for contacts with the center-to-center spacing of about 0.229 millimeters.

Figure 5:
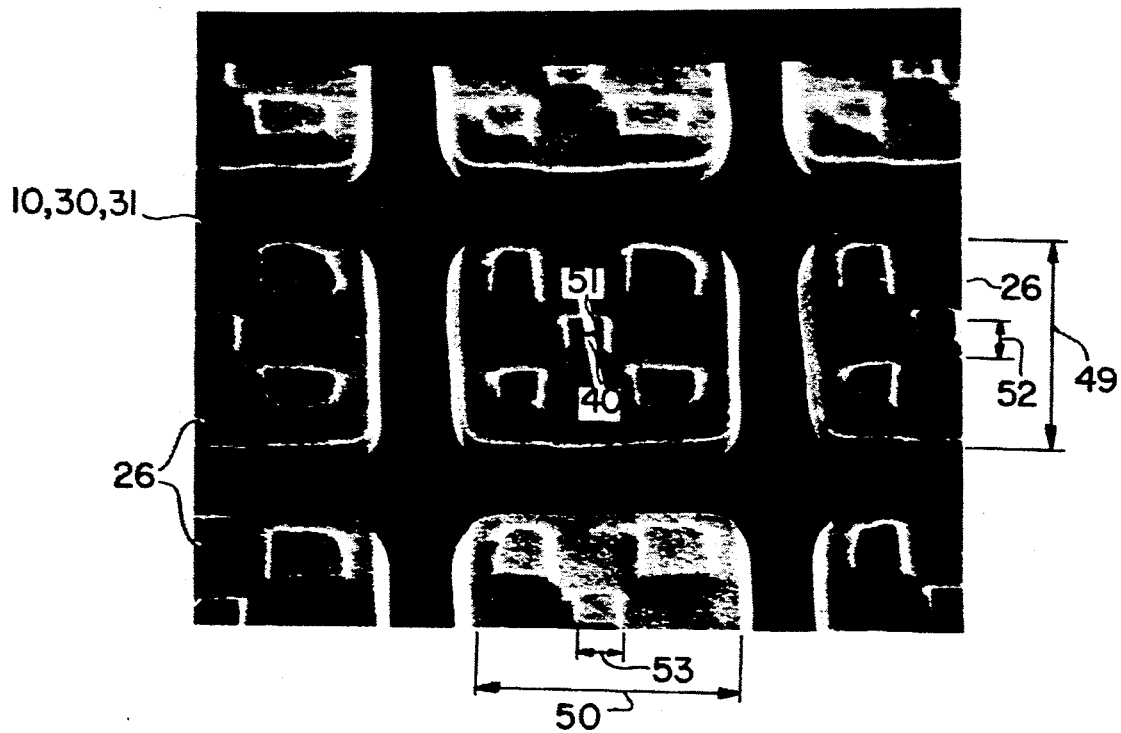
FIG. 5 is a view of an array of electrodes on the lower surface of a pellicle shown in FIG. 4.

FIG. 5 is a view of electrodes 26 taken below lower surface 30 of interface pellicle 10. In FIG. 5, electrodes 26 are rectangular with raised flat portions 51 and 56 thereon similar to a waffle iron or griddle. The raised rectangular or square center portion 51 of electrode 26 is centered with respect to axis 40 of electrode 26. Electrode 26 below lower surface 30 has a width shown by arrow 49 and a length shown by arrow 50. The height of electrode 26 below lower surface 30 may be in the range from about 0.050 to 0.010 millimeters for the center-to-center spacing of about 0.229 millimeters. The center portion 51 may have a width shown by arrow 52 and a length shown by arrow 53. The heights of the electrodes are scaled in relation to the center-to-center spacing of the electrodes.

Figure 6:
FIG. 6 is an enlarged view of a portion of FIG. 4.

FIG. 6 is an enlarged view of a portion of FIG. 4 taken above upper surface 27 of interface pellicle 10. FIG. 6 shows electrode 26 with one end which is rounded intended for interconnection with a flat pad of a rigid space transformer. In FIG. 6 the height of electrode 26 above upper surface 27 is about 0.050 millimeters.

Figure 7:
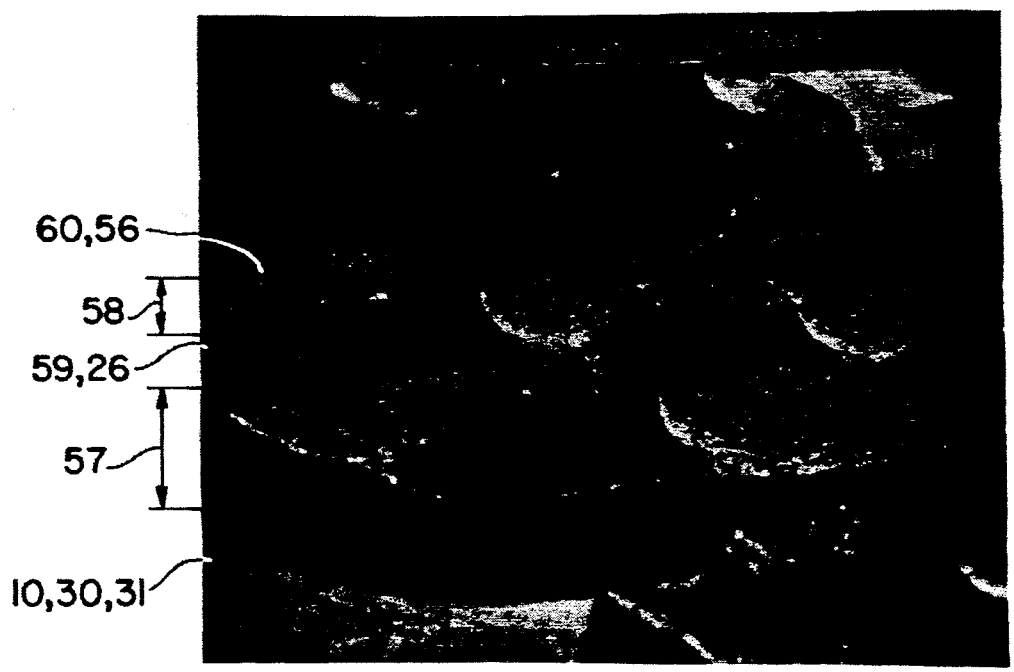
FIG. 7 is an enlarged view of a portion of FIG. 5.

FIG. 7 is an enlarged view of a portion of FIG. 5 taken below lower surface 30 of interface pellicle 10. FIG. 7 shows electrode 26 with a height of 0.025 millimeters above lower surface 30 to recessed surface 59 shown by arrow 57. The height of the raised portion 56 to its upper surface 60 is 0.0125 millimeters as shown by arrow 58 with respect to recessed surface 59.

Figure 8:
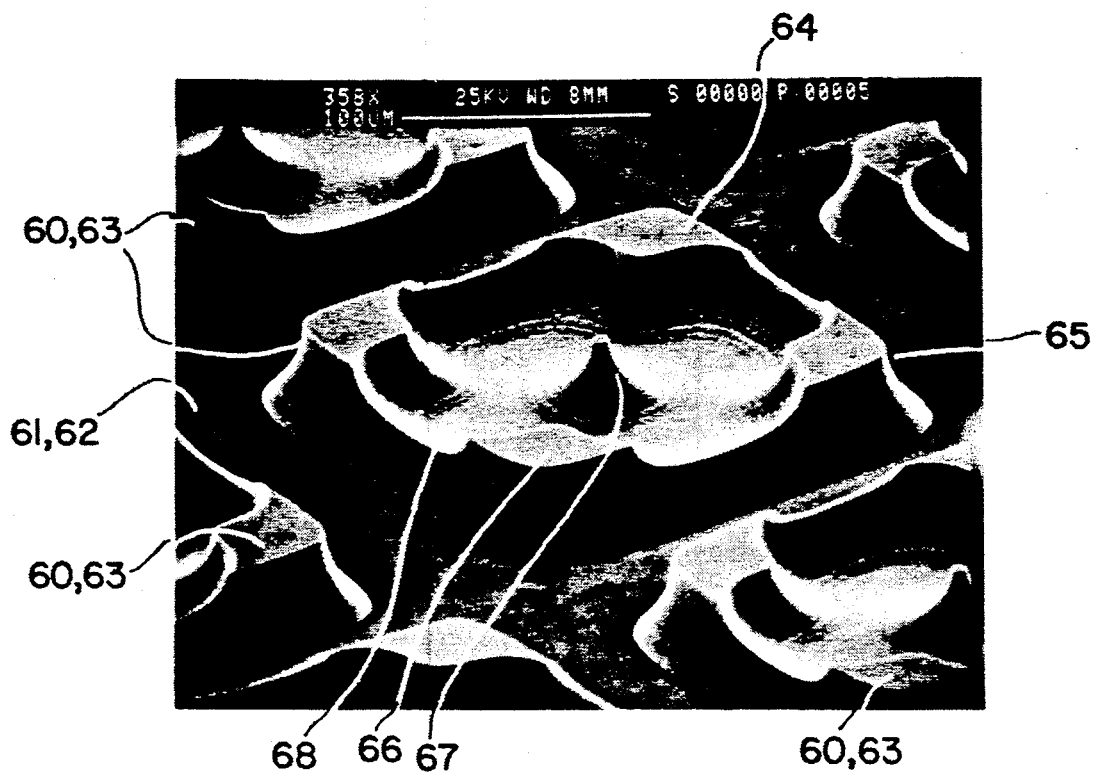
FIG. 8 is a view of a second embodiment of the invention showing an array of electrodes on the lower surface of a pellicle.

FIG. 8 is a view of an array of electrodes 60 on the lower surface 61 of pellicle 62. Pellicle 62 may be of the same material and thickness as pellicle 10. Electrodes 60 have raised portions 63–66 at the periphery and a raised portion 67 at the center of each electrode 60. The space between raised portions 63–66 and 67 is a recessed surface 68 which is rounded at its edges to the side walls of the raised portions 63–67. Raised portions 63–67 have an upper surface which is flat with sharp corners at its edges descending towards the recessed surface 68.

Figure 9:
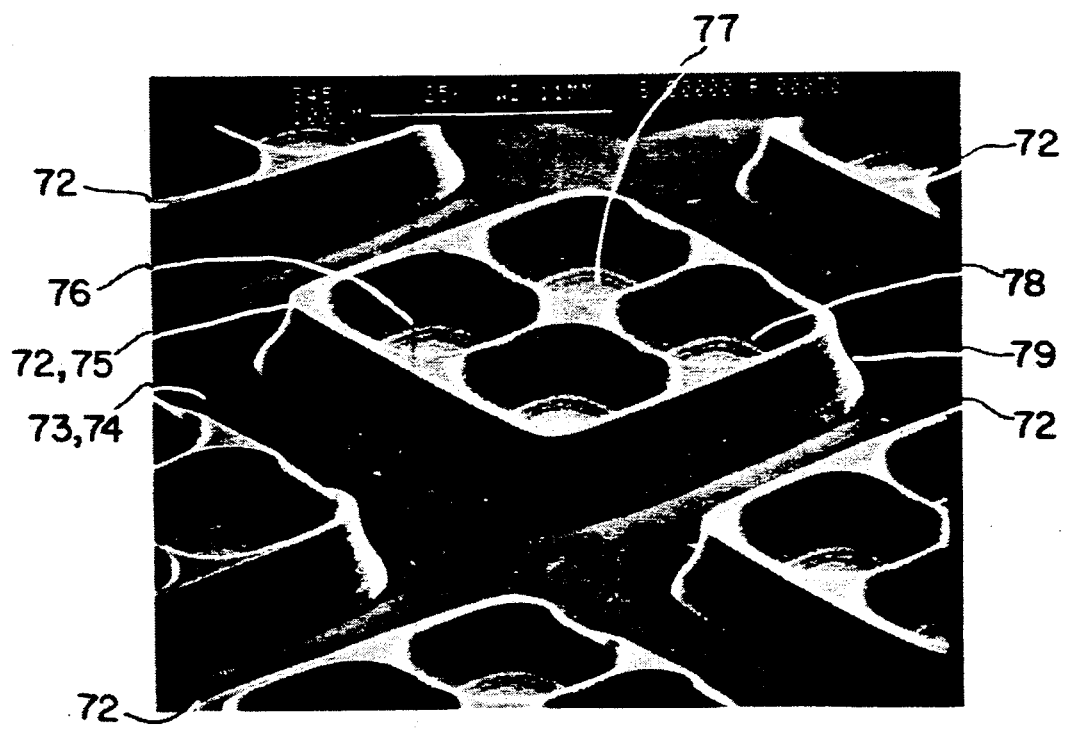
FIG. 9 is a view of a third embodiment of the invention showing an array of electrodes on the lower surface of a pellicle.

FIG. 9 is a view of an array of electrodes 72 on the lower surface 73 of pellicle 74. Pellicle 74 may be of the same material and thickness as pellicle 10. Electrodes 72 has raised portion 75 extending around the periphery of electrode 72 and across the center of electrode 72 from the center of each side to the center of the opposite side. Electrode 72 has four recessed surfaces 76–79 of equal size surrounded by continuous raised portion 75 which also provides structural strength to electrode 72. Electrode 72 has a shape to prevent the formation of deep isolated indents in the C4 bump to prevent the formation of voids during solder reflow to reshape the C4 bump after electrical testing.

Figure 10:
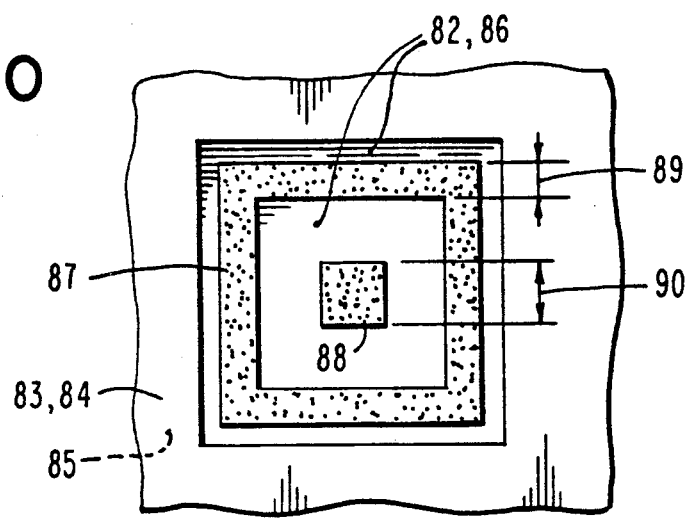
FIGS. 10-14 show fourth through eighth embodiments of electrodes on the lower surface of a pellicle.

FIG. 10 is a top view of an electrode 82 suitable to be used in an array of electrodes affixed to a pellicle 83 on the lower surface 84. The upper surface 85 of pellicle 83 may have an electrode 82 with an end similar to electrode 26 shown in FIGS. 4 and 6. Electrode 82 has a recessed surface 86 around the periphery and between raised portions 87 and 88. Raised portion 87 forms a rectangle having a uniform width shown by arrow 89. Raised portion 88 forms a square at the center of electrode 82 with its sides aligned with the sides of raised portion 87. Raised portion 88 has a width shown by arrow 90.

Figure 11:
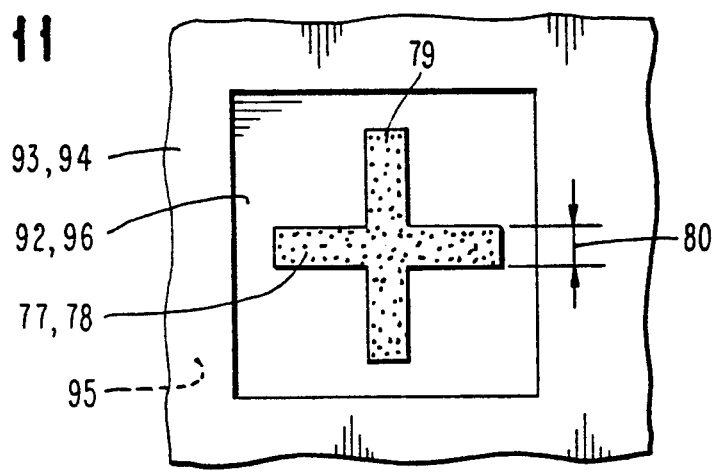

FIG. 11 is a top view of an electrode 92 suitable to be used in an array of electrodes affixed to a pellicle 93 on lower surface 94. The upper surface 95 of pellicle 93 may have an electrode 92 with an end similar to electrode 26 shown in FIGS. 4 and 6. Electrode 92 has a recessed surface 96 with a raised portion 77 forming a plus sign i.e. two lengths of raised portions 78 and 79 crossing at right angles at their center having equal lengths and equal widths shown by arrow 80.

Figure 12:
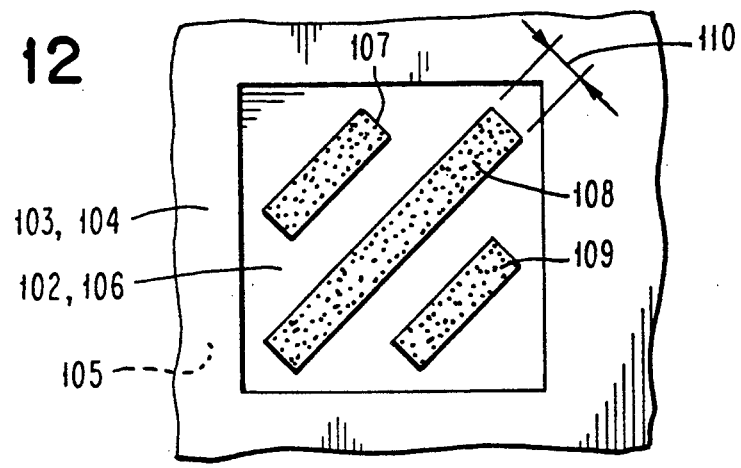

FIG. 12 is a top view of an electrode 102 suitable to be used in an array of electrodes affixed to pellicle 103 on the lower surface 104. The upper surface 105 of pellicle 103 may have an electrode 102 with an end similar to electrode 26 shown in FIGS. 4 and 6. Electrode 102 has a recessed surface 106 with three raised portions 107–109 thereon aligned parallel to one another of uniform width shown by arrow 110 and each having a length so as not to extend to the edge 111 of recessed surface 106.

Figure 13:
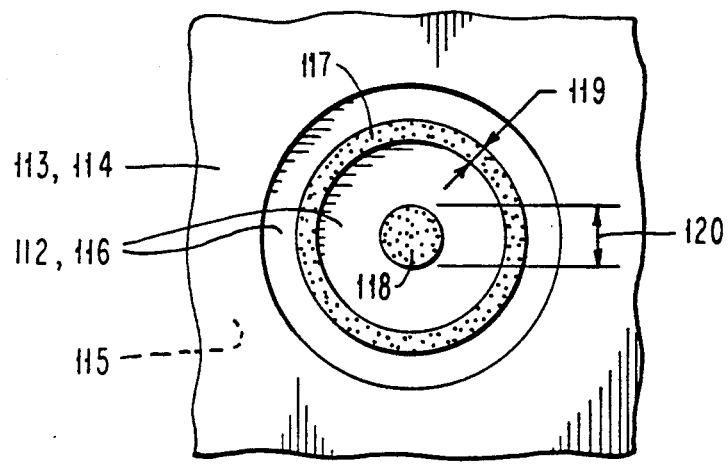

FIG. 13 is a top view of an electrode 112 suitable to be used in an array of electrodes affixed to pellicle 113 on the lower surface 114. The upper surface 115 of pellicle 113 may have an electrode 112 with an end similar to electrode 26 show in FIGS. 4 and 6. Electrode 112 has a recessed surface 116 with two raised portions 117 and 118 thereon. Raised portion 117 is a circular ring of uniform width show by arrow 119. Raised portion 118 is a circle of a diameter shown by arrow 120 positioned at the center and concentrate with raised portion 117. Recessed surface 116 is in between raised portions 117 and 118 and also outside of raised portion 118 around the periphery of electrode 112.

Figure 14:
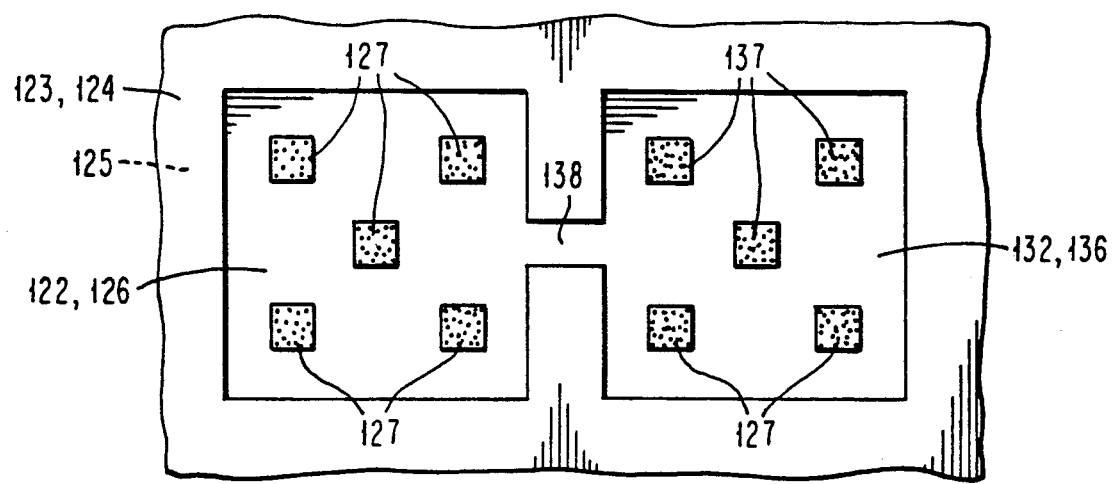

FIG. 14 is a top view of electrodes 122 and 132 suitable to be used in an array of electrodes affixed to pellicle 123 on the lower surface 124. The upper surface 125 of pellicle 123 may have electrodes 122 and 132 with an end similar to electrode 26 shown in FIGS. 4 and 6. Electrode 122 has a recessed surface 126 with five raised portions 127, each having the shape of a rectangle which may be a square. Electrode 132 has a recessed surface 136 with five raised portions 137, each having the shape of a rectangle, which may be a square. Electrodes 122 and 132 are similar in size to electrodes 26 shown in FIG. 5 except electrodes 122 and 132 are electrically connected together by strap or bar 138 which may have the same height as recessed surfaces 126 and 136. Strap 138 provides a low inductance and low resistive path between electrodes 122 and 132.

Figure 15:
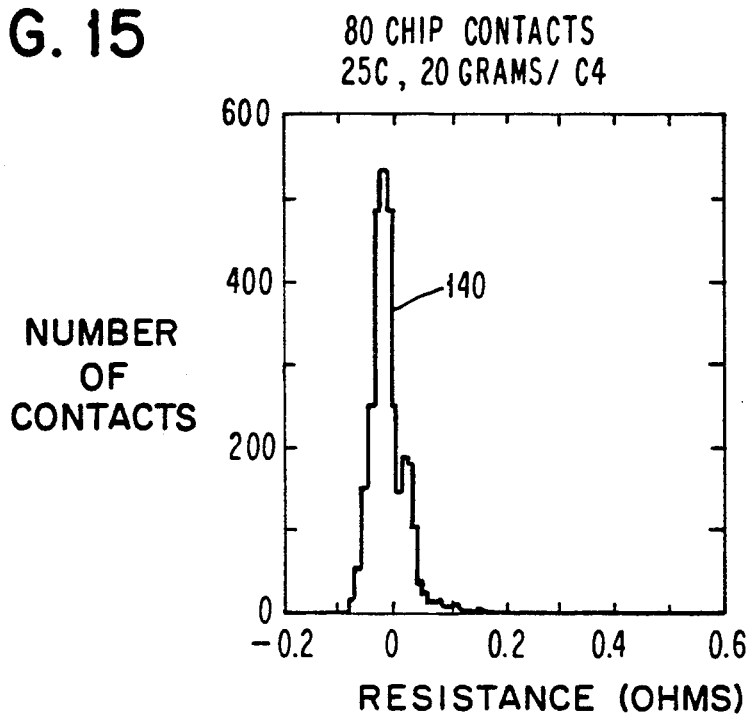
FIGS. 15 and 16 are graphs of the distribution of contact resistance versus the number of contacts.
Figure 16:
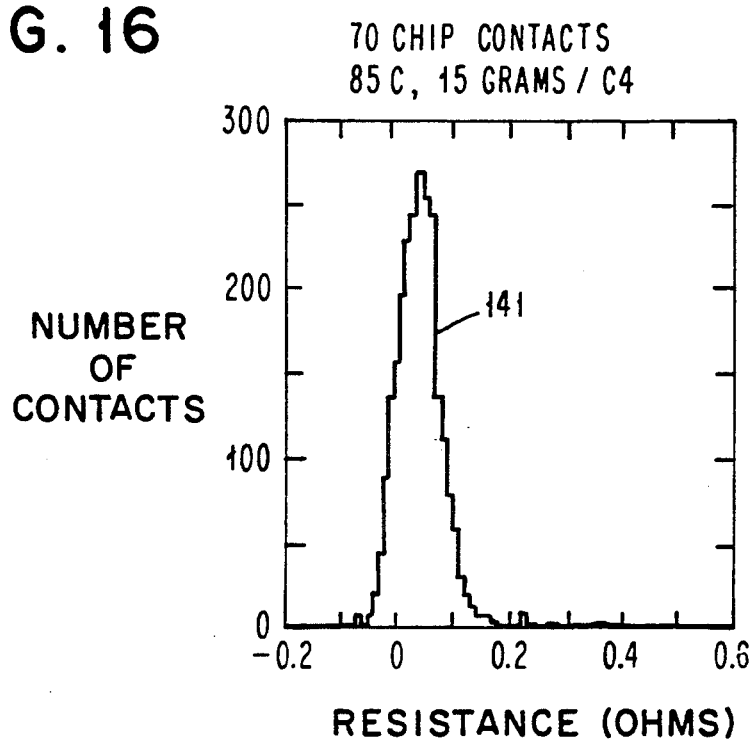

FIGS. 15 and 16 are graphs of the distribution of contact resistance versus the number of contacts. For the measurement of contact resistance, semiconductor chips were fabricated with an area array of 729 C4 bumps arranged evenly in 27 rows and 27 columns. An interface pellicle was fabricated with fifty electrodes which was used to measure the resistance of fifty contacts per chip. The fifty electrodes in the interface pellicle were distributed uniformly across the area array of 729 C4 bumps. In FIG. 15, eighty chips were successively connected by the interface pellicle with fifty electrodes to make a total of 4,000 contacts measured. In FIG. 16, seventy chips were successively connected by the interface pellicle with fifty electrodes to make a total of 3,500 contacts measured. In FIGS. 15 and 16, the ordinate represents number of contacts and the abcissa represents resistance in ohms. In FIGS. 15 and 16 the interconnection was made with an electrode shaped as shown in FIGS. 3,5 and 7 to C4 bumps. In FIG. 15, the measurements of interconnection resistance were taken at 20 degrees centigrade with 20 grams per C4 bump applied. In FIG. 16, the measurements of interconnection resistance were taken at 85 degrees Centigrade with 15 grams per C4 bump applied. Curve 140 in FIG. 15 and curve 141 in FIG. 16 show the distribution of contact resistance versus the number of contacts. In FIGS. 15 and 16, a large fixed resistance due to cable length which is on the order of several ohms was subtracted off of each contact resistance measurement. Due to measurement variations, some resistances shown in FIGS. 15 and 16 are shown as being negative when the resistances in FIGS. 15 and 16 are really positive.

Figure 17:
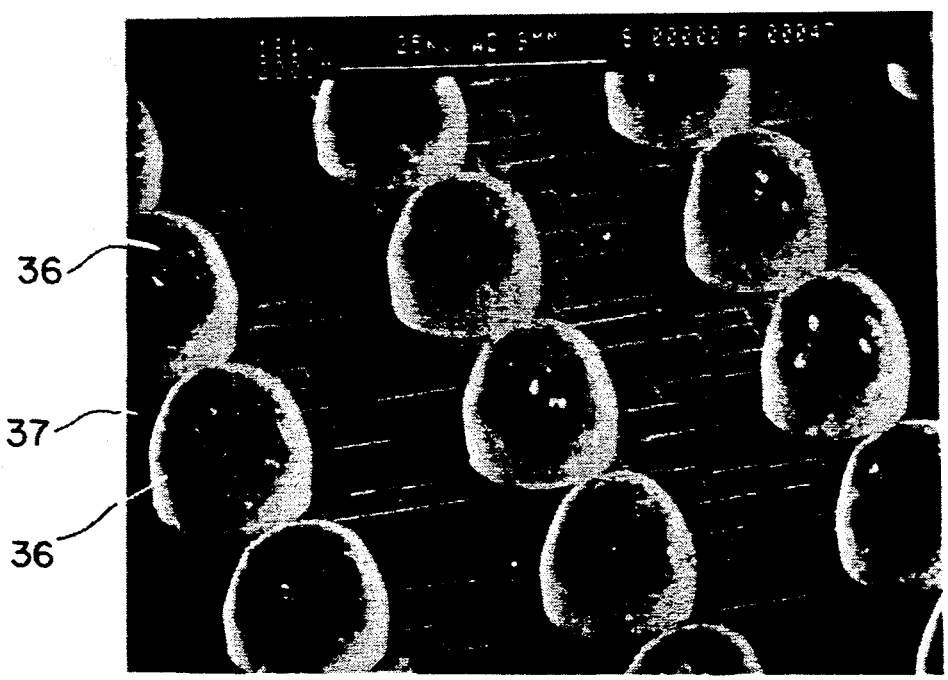
FIG. 17 is a view of C4 bumps on a wafer before probing.
Figure 18:
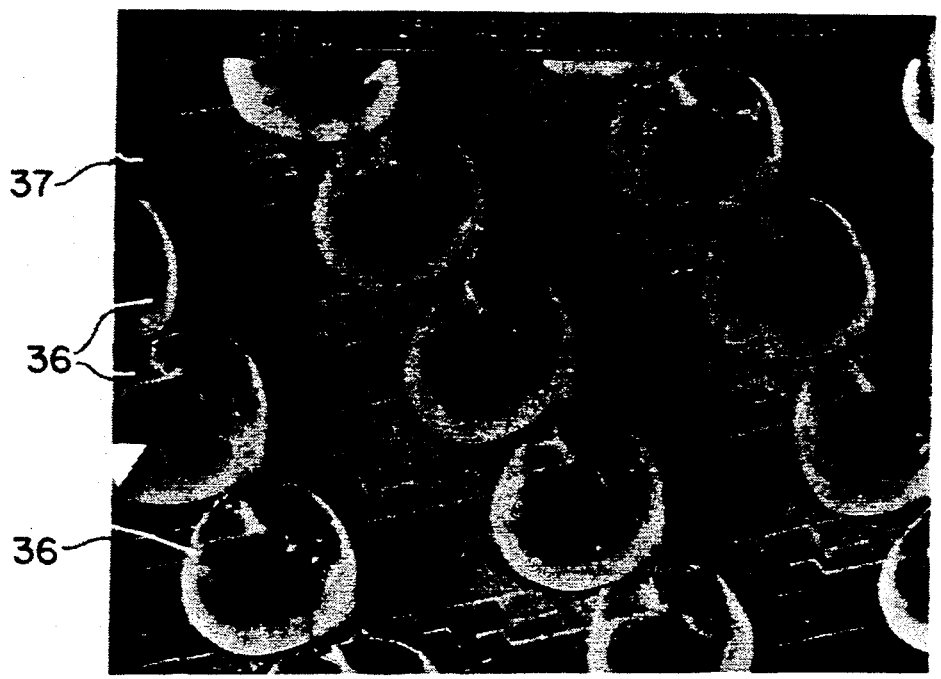
FIG. 18 is a view of the C4 bumps on a wafer as shown in FIG. 17 after probing with an interface pellicle.

FIG. 17 is a view of C4 bumps 36 on wafer 37 before probing. FIG. 18 is a view of C4 bumps 36 on wafer 37 after probing with an array of electrodes 26 as shown in FIGS. 5 and 7.

Figure 19:
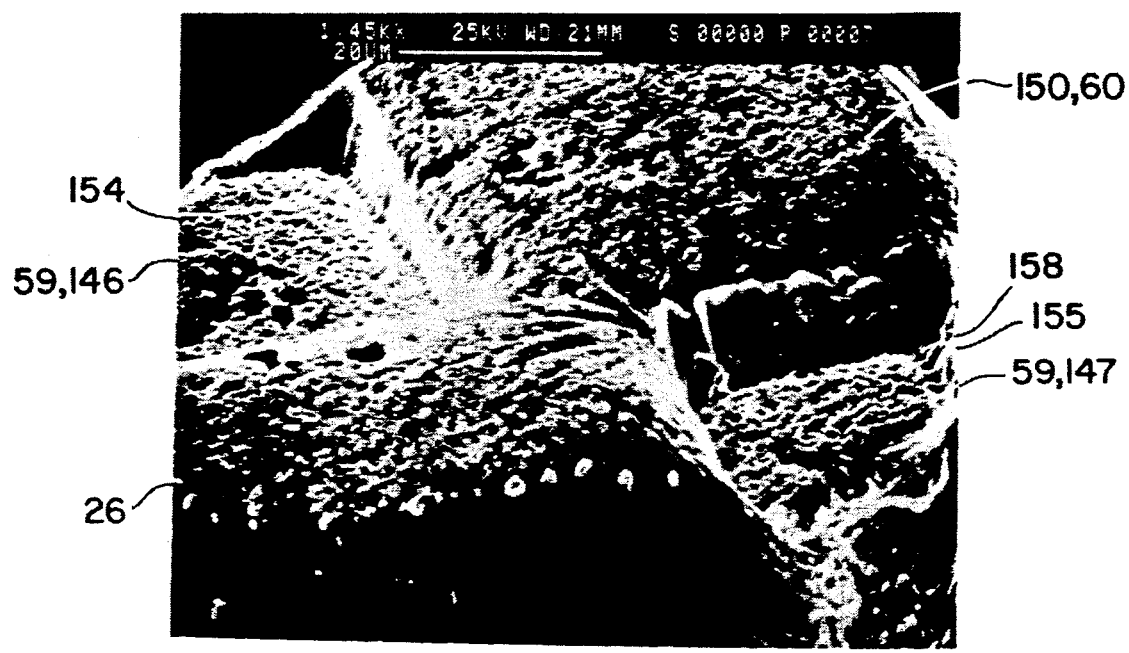
FIGS. 19 and 20 are enlarged views of two C4 bumps shown in FIG. 18.
Figure 20:
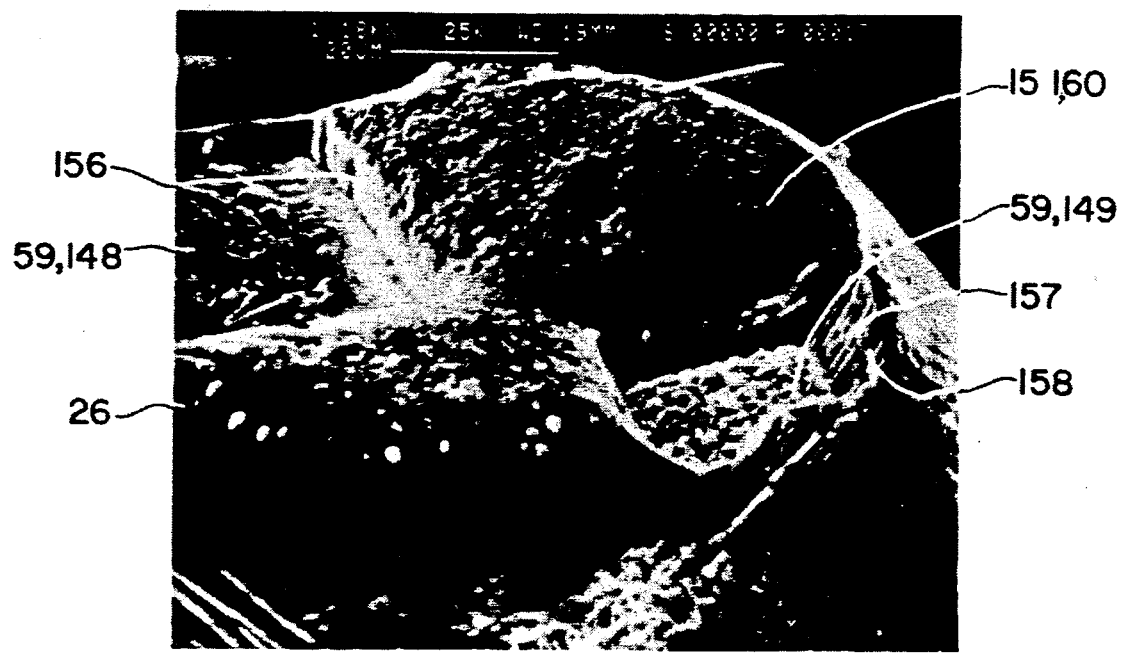

FIGS. 19 and 20 are enlarged views of two C4 bumps 26 shown in FIG. 18 by adjusting the scanning electron microscope. In FIGS. 19 and 20, depressed areas 146–149 are due to the penetration of raised portions 51 and 56 of electrode 26. The penetration of raised portions 51 and 56 was limited by surfaces 150 and 151 which were pressed against recessed surfaces 59 of electrode 26.

The penetration of raised portions 51 and 56 created side walls 154–157 between surfaces 60, 150 and 151 and depressed areas 59, 146–149 respectively. Side walls 154–157 are new and clean and show small ridges 158 due to the motion of the raised portions which show that electrode 26 rocked or rotated slightly as its raised potion penetrated C4 bump 36.

FIG. 21 is a cross-section view of electrode 160 on a pellicle or membrane 161 wherein electrode 160 has a current sensitive element 162 which functions as a fuse at times currents are excessive, for example upon a short circuit. Current sensitive element 162 may be fabricated from low melting point metals by depositing layers internal to the electrode along a transverse area to sever or separate the electrode at times the electrode exceeds a predetermined temperature due to excessive currents. Low melting point metals may be selected from the group consisting of copper, indium and gold. Platium, palladium, and nickel are examples of other higher melting point metals which may also be used alone or with the lower melting point metals mentioned above.

FIG. 22 is a cross-section view of electrode 166 on membrane 167 wherein electrode 166 has a current sensitive element 168 which functions as a fuse at times currents are excessive, for example upon a short circuit. Current sensitive element 168 may be a length of conductive material 169 wherein its conductive path will open by melting or evaporating at times current is excessive thereby raising the temperature above a predetermined value.

As shown in FIG. 22, the ends of electrode 166 are off set from the other by a predetermined distance. The offset also permits electrode 166 to rotate slightly when pressure or force is applied which results in wiping of the surfaces in contact. The upper contact of electrode 166 has an axis 170 through its center which is transverse or orthogonal to membrane 167. The lower contact of electrode 166 has an axis 171 through its center which is transverse or orthogonal to membrane 167. The offset distance between axis 170 and 171 is shown by arrow 172.

FIG. 23 is similar to FIG. 3 except for the addition of an alignment sheet 180 which has a thickness and openings 181 to permit a C4 bump 36 to pass through and be contacted by electrode 26. Opening 181 as shown by arrow 182 is larger than the diameter of the C4 bump 36 as shown by arrow 183 but small enough to support the sides of a deformed C4 bump 36 at times it is softened due to temperature such as during burn-in to prevent it from shorting to an adjacent C4 bump 36. The diameter of a C4 bump may be about 0.125 millimeters as shown by arrow 183.

FIG. 23 is shown with the wafer 37 below alignment sheet 180. Alternately, FIG. 23 may be turned upside down, to show the alignment sheet 180 resting above interface pellicle 10. Wafer 37 or a chip may be placed or positioned over alignment sheet 180 with coarse alignment such as by a chip template and vibrated to align the C4 bumps with the corresponding openings 181 in alignment sheet 180. When alignment occurs, wafer 37 drops toward the alignment sheet 180 with the C4 bumps passing into the corresponding openings wherein platform 38 moves wafer 37 toward space transformer 12 wherein electrical interconnections are made through pellicle 10. Alignment sheet 180 also protects interface pellicle 10 from dirt and other particles falling from wafer 37 or vice versa depending on the direction of gravity. One feature of electrode 26 shown in FIGS. 4–7 is to provide a shape to prevent the creation of particles from the C4 bumps due to probing in the first place. Electrode 26 may include gold, silver, palladium, platinum, chromium, lead, tin, copper, nickel and alloys thereof. C4 bumps are made mostly of lead and tin and may have oxide layers thereon which are hundreds of Angstroms thick. Metallic and oxide debris may be generated, transferred and accumulated at specific or at random sites during successive testing of chips and wafers 37. After testing, wafer 37 may be removed by lifting the chip or wafer 37 above alignment sheet 180. Alignment sheet 180 may be periodically cleaned of debris.

Figure 24:
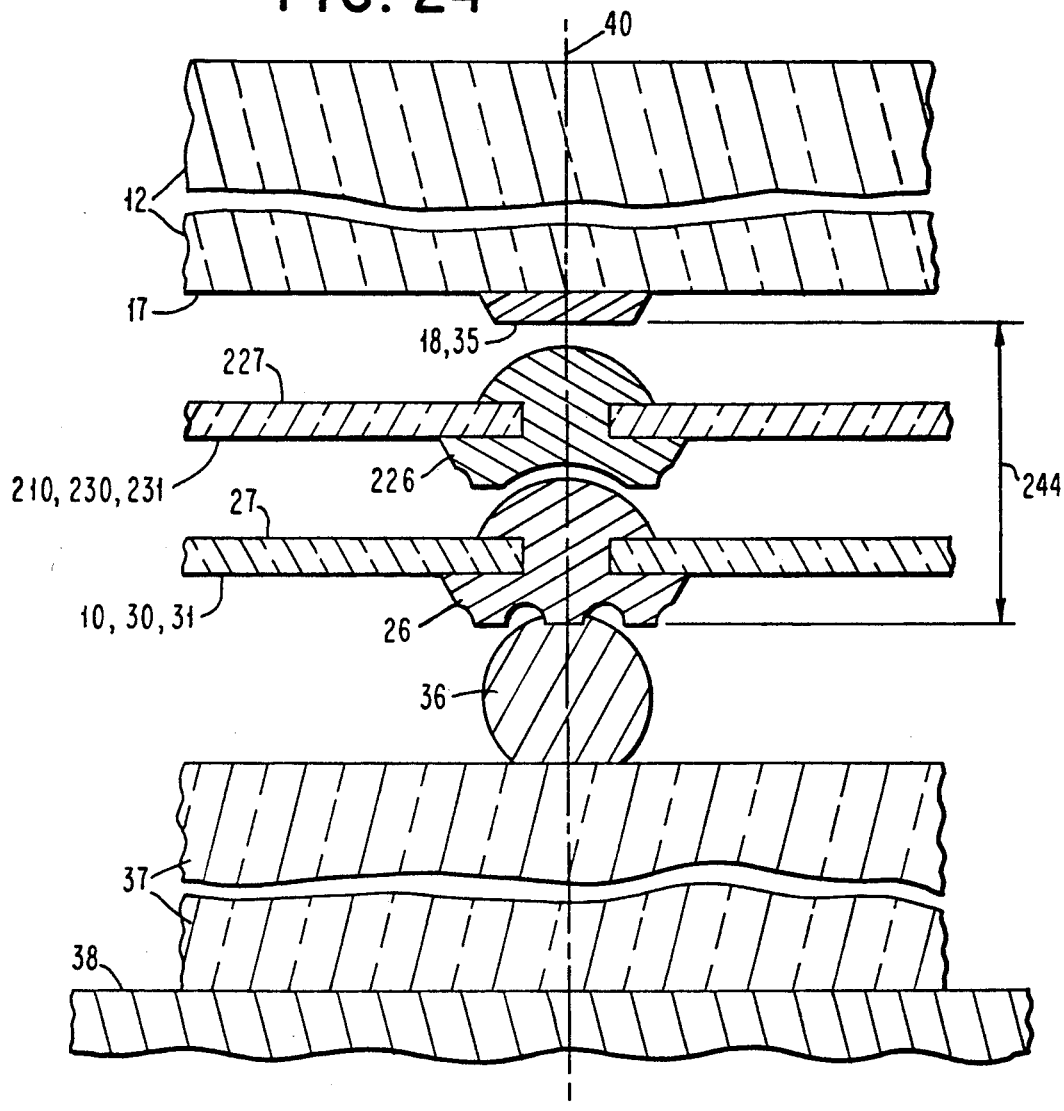
FIG. 24 is a twelfth embodiment of the invention showing an enlarged cross-section view of two stacked interface pellicles positioned between a pad on a space transformer and a C4 bump on a wafer.

FIG. 24 is an enlarged view of two stacked interface pellicles 10 and 210 positioned between a pad 18 on space transformer 12 and C4 bump 36 on wafer 37 prior to applying force by reducing the distance shown by arrow 244 between pad 18 and C4 bump 35. In FIG. 24, like reference numerals correspond to the same function or apparatus as shown in FIGS. 2 and 3. Pellicle 210 has a membrane 230, a lower surface 231 and an upper surface 227. Contact 226 may be shaped for optimal electrical contact with contact 26 on upper surface 27 of membrane 30. For example, contact 226 may be shaped with a spherical concave surface to positively seat and align contact 26 and to provide a non-piercing contact with a large surface area to contact 26. Contact 226 may be interconnected to other contacts not shown on pellicle 210. Thus, different test inter-connections may be provided by pellicle 226 and other substitute pellicles inserted in its place. For example, ground connections, signal connections, and power supply connections may be varied between different pellicles 226. Membrane 230 may be of the same material as membrane 30 or it may be of stiffer material that is less flexible.

Figure 25:
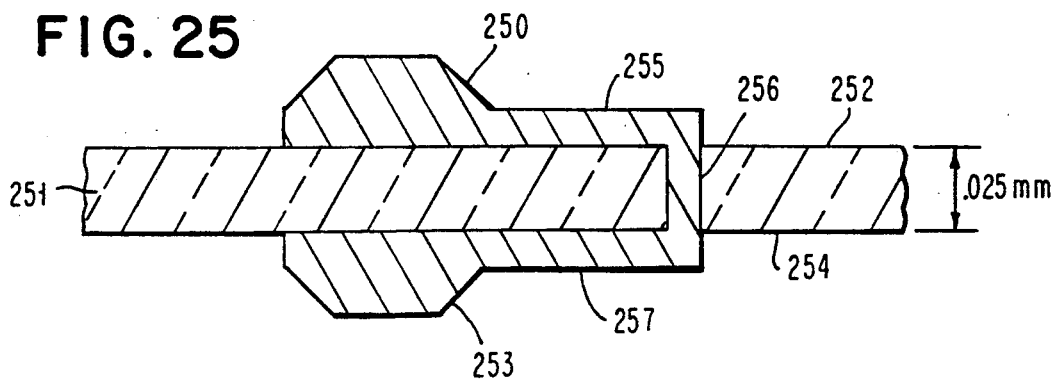
FIG. 25 is a thirteenth embodiment of the invention showing an enlarged cross-section view of an electrode on a pellicle having a current sensitive element.

FIG. 25 shows an enlarged cross-section view of electrode 250 on pellicle 251 on upper surface 252 and electrode 253 on lower surface 254 interconnected by current sensitive elements 255-257. Current sensitive elements 255-257 may be a conductive length of material which functions as a fuse at times currents are excessive. Elements 255-257 have portions away from contacts 250 and 253 to reduce thermal conduction through the contacts to the space transformer or C4 bump on a wafer. Further, the opening of one of elements 255-257 will remain open with out any mechanical influence from contact pressure of contacts 250 and 253 as opposed to the embodiment in FIG. 21.

Figure 26:
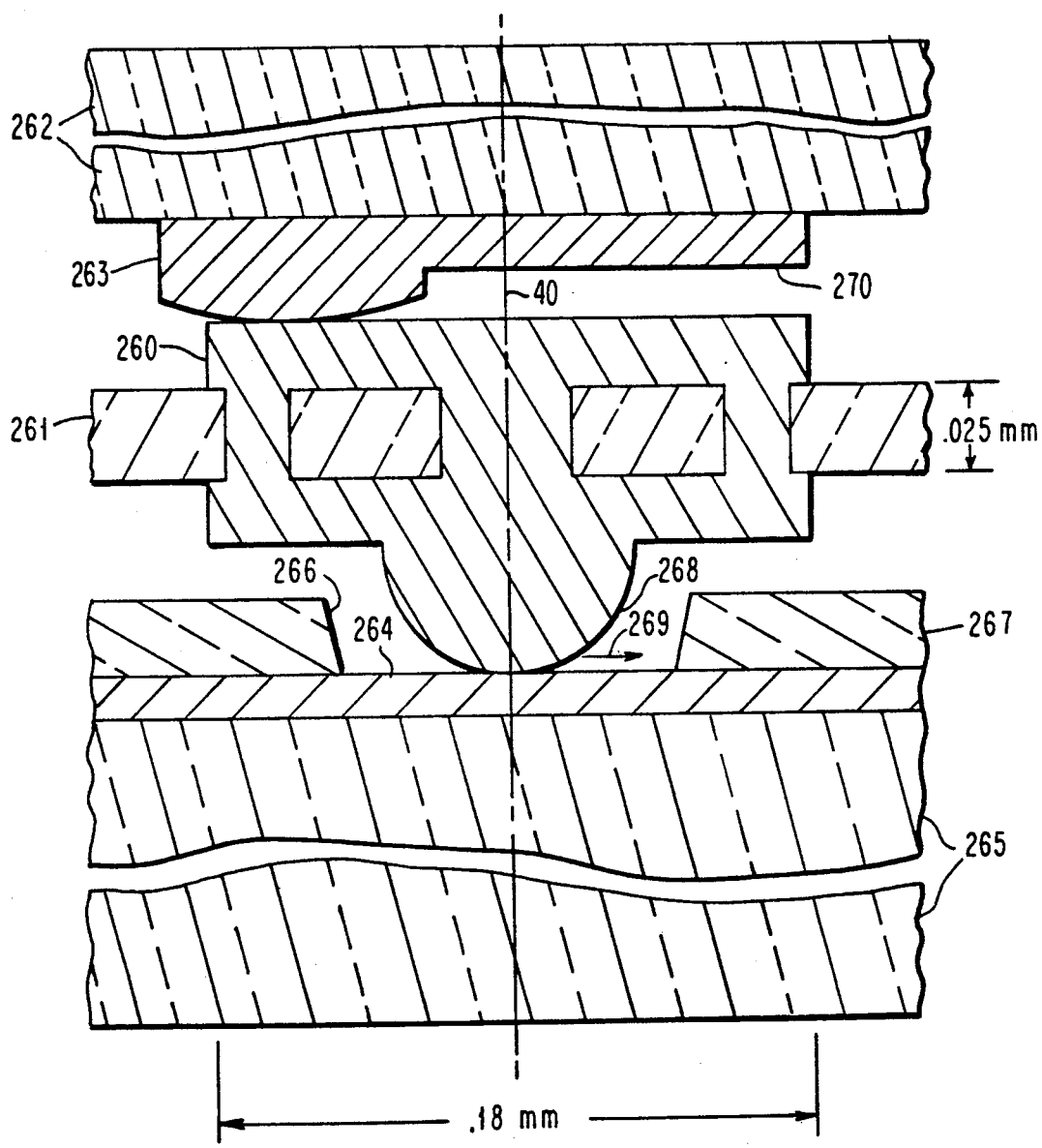
FIG. 26 is a fourteenth embodiment of the invention showing an enlarged cross-section view of an electrode on a pellicle and a space transformer to provide electrical contact to a recessed pad.

FIG. 26 is an enlarged cross-section view of electrode 260 on pellicle 261. Space transformer 262 has a pad 263 shaped to cause electrode 260 to rock when pressure is applied to make contact with recessed pad 264 on substrate 265. Substrate 265 may be rigid i.e. ceramic, silicon, etc. Pad 264 may be an intregal part of the metallization interconnects on substrate 265 and may be defined by an opening 266 in insulating layer 267. Pad 264 may have a width of 0.1016 mm (0.004") sufficient to allow the lower portion 268 of electrode 260 to reach it and to move laterally due to rotation of electrode 260 shown by arrow 269. As space transformer 262 moves toward substrate 265, pad 263 which is asymetric pushes the left side of electrode 260 down causing electrode 260 to rotate until the right side of electrode 260 touches pad 263 at or near surface 270. Pellicle 261 is flexible to enable the rotation by electrode 260. The rotation of electrode 260 enables a scraping motion shown by arrow 269 by electrode 260 on pad 264 permitting better electrical contact.

Figure 27:
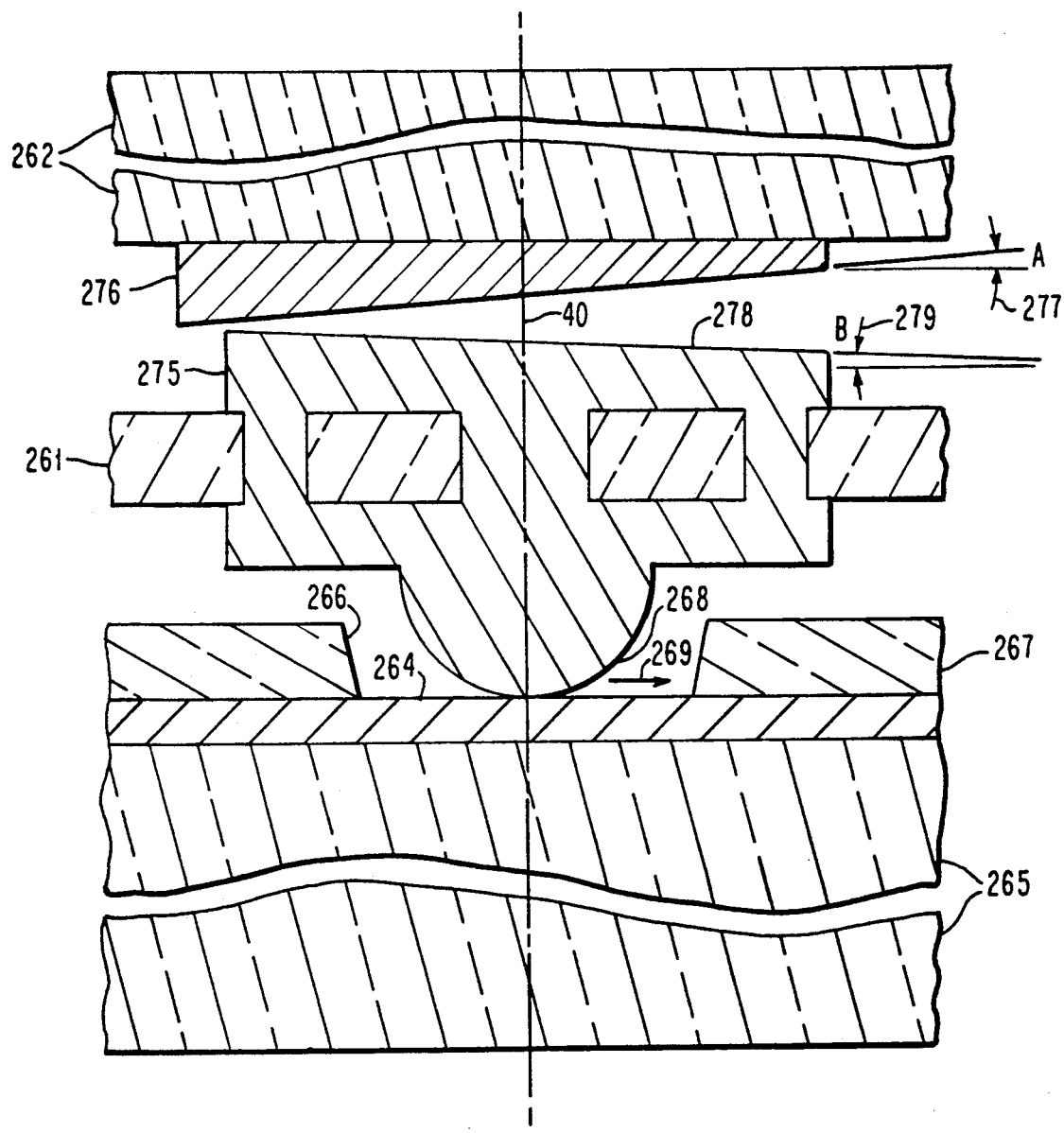
FIG. 27 is a fifteenth embodiment of the invention showing an enlarged cross-section view of an electrode on a pellicle and a space transformer to provide electrical contact to a recessed pad.

FIG. 27 is an enlarged cross-section view of electrode 275 on pellicle 261 and of space transformer 262 with pad 276. In FIG. 27, like references are used for functions corresponding to the apparatus in FIG. 26. Pad 276 is slanted or inclined at an angle A shown by arrow 277 with respect to the supporting surface of space transformer 262. The slant of pad 276 functions to cause electrode 275 to rotate causing lateral motion of lower portion 268 shown by arrow 269. Alternately, electrode 275 may have its upper surface 278 slanted or inclined at an angle B shown by arrow 279. The slant of upper surface 278 of electrode 275 likewise functions to cause electrode 275 to rotate causing lateral motion of lower portion 268 shown by arrow 269. As shown in FIG. 27, both electrode 275 and pad 276 may be inclined or one may be inclined with sufficient incline to cause lateral motion shown by arrow 269.

Figure 28:
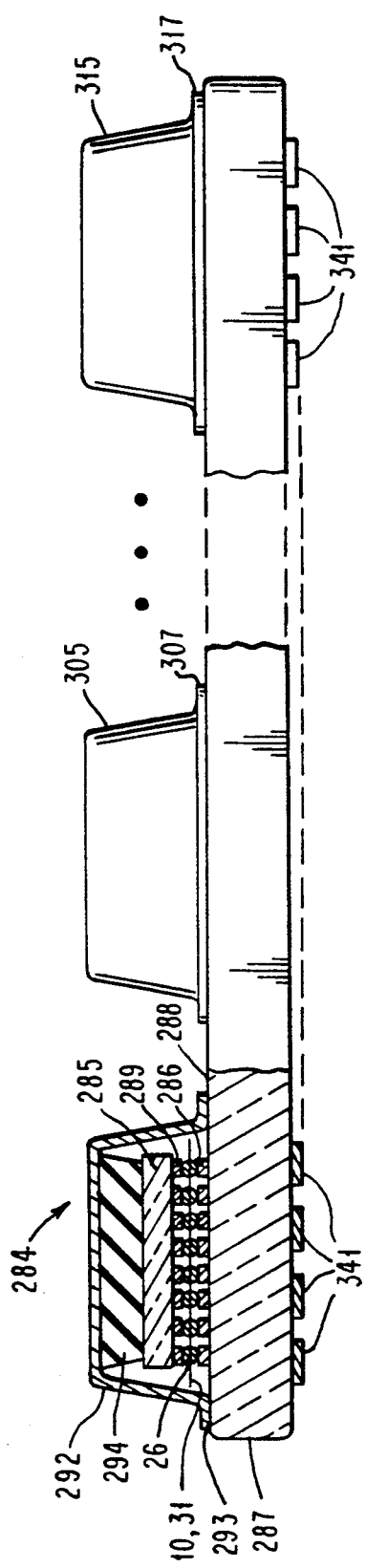
FIG. 28 is a sixteenth embodiment of the invention showing an enlarged partial cross-section view of an interface pellicle between semiconductor chips and a thermal conduction module.

Referring to FIG. 28, an enlarged cross-section view of an apparatus 284 is shown. An array of first contacts 286 are positioned in a two-dimensional array on upper surface 288 of thermal conduction module 287. Thermal conduction module 287 provides support to the array of first contacts 286 to withstand a predetermined force. Thermal conduction module 287 may be for example a ceramic substrate with multilayer wiring levels on upper surface 288 that may be interconnected to the array of first contacts 286. An interface pellicle 10 is positioned with its electrodes 26 aligned with the array of first contacts 286. Electrical device 285 has an array of second contacts 289 positioned in a two-dimensional array and supported by electrical device 285 to withstand a predetermined force. A clamping mechanism 292 supports electrical device 285 to withstand the predetermined force in fixed relationship with the array of first contacts 286. Clamping mechanism 292 may be attached to thermal conduction module 287 with an adhesive 293 for example epoxy resin or some other polymer or with rivets, screws, or bolts. Clamping mechanism 292 may apply and maintain a predetermined force to electrical device 285 which in turn applies force through electrodes 26 to the array of first contacts 286. Clamping mechanism 292 may include a spring 294 etc. to apply and maintain force or may include elastomeric material, foam, polymeric material, rubber, etc. to apply and maintain force to electrical device 285. Materials which are good thermal conductors may be preferred.

Also shown in FIG. 28 is camping mechanism 305 which is above an additional array of contacts, not shown, on upper surface 288 of thermal conduction module 287. Above the array of contacts is an interface pellicle with electrodes therein aligned with the contacts on the device. Clamping mechanism 305 holds the device under a constant force by a spring or other suitable means. An adhesive 307 holds clamping mechanism 305 to upper surface 288.

Clamping mechanism 315 holds a device, not shown, under constant force by a spring or other suitable means. Upper surface 288 has an array of contacts underneath an interface pellicle, not shown, with its electrodes aligned with the contacts on surface 288, not shown, and with contacts on the device, not shown, similar to device 285, electrodes 26 and contacts 286 shown in FIG. 28. Adhesive 317 holds clamping mechanism 315 to upper surface 288. Clamping mechanisms 292, 305 and 315 may be spaced apart in an array of clamping mechanisms.

Figure 29:
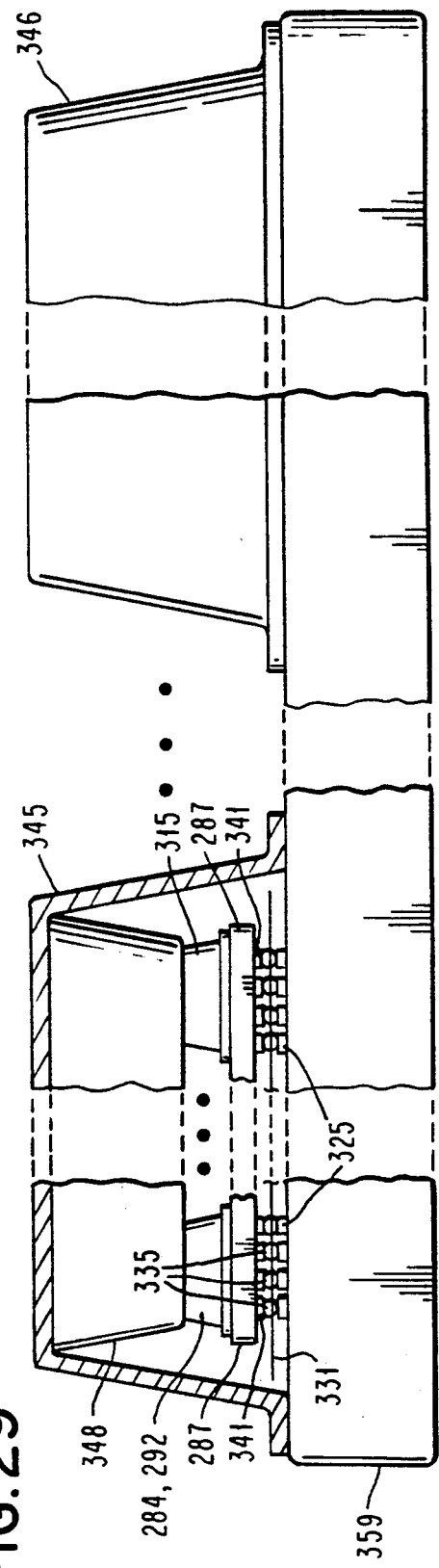
FIG. 29 is a seventeenth embodiment of the invention showing of an enlarged partial cross-section view of an interface pellicle between a thermal conduction module and a printed circuit board.

Referring to FIG. 29, a thermal conduction module 287 having an array of contacts 341 is shown interconnected to a respective array of contacts 325 by way of interface pellicle 331 respectively. Interface pellicle 331 has a respective array of electrodes 335 which is positioned underneath array of contacts 341 on thermal conduction modules 287. Array of contacts 341 and 325 and array of electrodes 335 may be two dimensional. Contacts 341 and 325 and electrodes 335 may have a predetermined diameter, respectively, and have a uniform center-to-center spacing. Clamping mechanism 345 holds with an applied force i.e. with springs, foam, or polymeric material 348, apparatus 284 including thermal conduction module 287 against array of electrodes 335 on interface pellicle 31 which in turn are against array of contacts 325. Contacts 325 may be supported and interconnected by metalization on a printed circuit board 359. Clamping mechanism 346 holds with an applied force an apparatus similar to apparatus 284, not shown, against an array of electrodes similar to electrodes 335 on an interface pellicle, not shown, inside clamping mechanism 346. Printed circuit board 359 may have contacts or a connector thereon for making interconnections. Clamping mechanisms 345 and 346 may be spaced part in an array of clamping mechanisms.

In FIGS. 2-29, like references are used for functions corresponding to the apparatus of the preceeding or earlier Figure.

Having thus described our invention, what we claim as new and desire to secure by Letters Patents is:

1. An apparatus for providing electrical contact between an array of first contacts forming a first rigid probe adapted to transfer force and a corresponding array of raised conductive bumps on an electrical device supported to withstand said force, said array of raised conductive bumps being substantially deformed under said transfer force, comprising:
   a flexible membrane having an upper surface and a lower surface, and
   an array of electrodes formed in said flexible membrane and extending above said upper surface and below said lower surface along respective longitudinal axes of said electrodes,
   each said electrode having a first end extending above said upper surface and a second end extending below said lower surface and a first predetermined length along said respective longitudinal axis,
   said first end of said electrode having a plurality of first raised portions for penetrating the surface of said conductive bump to create a plurality of non-contiguous sidewalls having a maximum predetermined depth,
   said first end of said electrode having a second recessed portion adjacent and between said first raised portions to limit the penetration of any of said plurality of said first raised portions into the surface of said conductive bump,
   said flexible membrane having a thickness to form at times a curved upper and lower surface having a minimum radius of curvature in localized regions and an elasticity to provide for a predetermined elastic deformation of said flexible membrane in localized regions to permit said electrodes to move independently.

2. The apparatus of claim 1 wherein said array of electrodes are spaced apart in a pattern having a center-to-center spacing of less than 0.381 mm (0.015 inches).

3. The apparatus of claim 1 wherein said flexible membrane has a thickness less than 0.127 mm (0.005 inches).

4. The apparatus of claim 1 wherein said flexible membrane has a thickness less than 0.0762 mm (0.003 inches).

5. The apparatus of claim 1 wherein said flexible membrane includes polyimide.

6. The apparatus of claim 1 wherein said flexible membrane includes polymeric material.

7. The apparatus of claim 1 wherein said array of electrodes includes at least 600 electrodes.

8. The apparatus of claim 1 wherein said second end of said electrode includes a rounded surface to enable said second end to rock against a contact having a flat surface.

9. The apparatus of claim 1 wherein said electrodes include a metal selected from the group consisting of copper and nickel.

10. The apparatus of claim 9 wherein said electrodes are formed by first electroplating copper through openings in said flexible membrane from a copper layer on one of said surfaces of said flexible membrane and second selectively etching said copper layer.

11. An apparatus for providing electrical contact between an array of first contacts forming a first rigid probe adapted to transfer force and a corresponding array of raised conductive bumps on an electrical device supported to withstand said force, said array of raised conductive bumps being substantially deformed under said transfer force, comprising:
    a flexible membrane having an upper surface and a lower surface, and
    an array of electrodes formed in said flexible membrane and extending above said upper surface and below said lower surface along respective longitudinal axes of said electrodes,
    each said electrode having a first end extending above said upper surface and a second end extending below said lower surface and a first predetermined length along said respective longitudinal axis,
    said first end of said electrode having one or more first raised portions thereon for penetrating the surface of said conductive bump at a force below 20 oz. to create sidewalls having a depth in said conductive bump,
    said first end of said electrode having a second recessed portion positioned adjacent said one or more first raised portions to limit the penetration of said first raised portion into the surface of said conductive bump,
    said flexible membrane having a thickness to form at times a curved upper and lower surface having a minimum radius of curvature in localized regions and an elasticity to provide for a predetermined elastic deformation of said flexible membrane in localized regions to permit said electrodes to move independently.

12. The apparatus of claim 11 wherein said second end of said electrode includes a rounded surface to enable said second end to rock against a contact having a flat surface.

* * * * *